US008797292B2

(12) United States Patent
Reynolds et al.

(10) Patent No.: US 8,797,292 B2
(45) Date of Patent: *Aug. 5, 2014

(54) TOUCH PAD WITH FLEXIBLE SUBSTRATE

(71) Applicant: Synaptics Incorporated, Santa Clara, CA (US)

(72) Inventors: Joseph Kurth Reynolds, Sunnyvale, CA (US); Shawn P. Day, Tai Po (HK)

(73) Assignee: Synaptics Incorporated, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/675,312

(22) Filed: Nov. 13, 2012

(65) Prior Publication Data
US 2013/0068602 A1    Mar. 21, 2013

Related U.S. Application Data

(63) Continuation of application No. 13/306,551, filed on Nov. 29, 2011, now Pat. No. 8,330,742, which is a continuation of application No. 12/209,762, filed on Sep. 12, 2008, now Pat. No. 8,085,250, which is a continuation of application No. 11/143,275, filed on Jun. 1, 2005, now Pat. No. 7,439,962.

(51) Int. Cl.
*G06F 3/045* (2006.01)
(52) U.S. Cl.
USPC ............................................ 345/174; 345/176
(58) Field of Classification Search
USPC .................... 345/173–183; 178/18.01–18.09, 178/19.01–19.06, 20.01–20.04
See application file for complete search history.

(56) References Cited

U.S. PATENT DOCUMENTS

| 4,484,038 A | 11/1984 | Dorman et al. |
| 4,743,895 A | 5/1988 | Alexander |
| 4,901,074 A | 2/1990 | Sinn et al. |
| 4,920,343 A | 4/1990 | Schwartz |

(Continued)

FOREIGN PATENT DOCUMENTS

| JP | 3194819 | 8/1991 |
| JP | 4092325 | 3/1992 |

(Continued)

OTHER PUBLICATIONS

Joseph Kurth Reynolds, "BGA ASIC on Screened PET Sensor", Synaptics Incorporated, 2004, pp. 1-2.
Thomas H. Stearns, "Flexible Printed Circuitry", McGraw-Hill, NY, 1996, pp. 1-239.

(Continued)

*Primary Examiner* — Vijay Shankar
(74) *Attorney, Agent, or Firm* — Ingrassia Fisher & Lorenz P.C.

(57) ABSTRACT

A touch sensor device is provided that uses a flexible circuit substrate to provide an improved input device. Specifically, the present invention uses a touch sensor controller affixed to the flexible circuit substrate, which is coupled to a sensor component to provide a flexible, reliable and cost effective touch sensor suitable for a wide variety of applications. In one embodiment the touch sensor uses a flexible circuit substrate that provides relatively high temperature resistance. This allows the touch sensor controller to be affixed using reliable techniques, such as various types of soldering. The sensor component can comprise a relatively low-temperature-resistant substrate that can provide a cost effective solution. Taken together, this embodiment of the touch sensor provides reliability and flexibility at relatively low cost.

20 Claims, 6 Drawing Sheets

(56) References Cited

U.S. PATENT DOCUMENTS

| | | | |
|---|---|---|---|
| 5,189,417 | A | 2/1993 | Caldwell et al. |
| 5,341,233 | A | 8/1994 | Tomoike et al. |
| 5,667,884 | A | 9/1997 | Bolger |
| 6,002,389 | A | 12/1999 | Kasser |
| 6,002,594 | A | 12/1999 | Ledin et al. |
| 6,137,427 | A | 10/2000 | Binstead |
| 6,297,811 | B1 | 10/2001 | Kent et al. |
| 6,479,775 | B2 | 11/2002 | Shigetaka et al. |
| 6,680,731 | B2 | 1/2004 | Gerpheide et al. |
| 6,819,316 | B2 | 11/2004 | Schulz et al. |
| 8,085,250 | B2 * | 12/2011 | Reynolds et al. ............ 345/173 |
| 2002/0180686 | A1 | 12/2002 | Yuda et al. |

FOREIGN PATENT DOCUMENTS

| | | |
|---|---|---|
| JP | 7005487 | 10/1995 |
| WO | 86/06551 | 11/1986 |
| WO | 98/30967 | 7/1998 |

OTHER PUBLICATIONS

John H. Lau, "Handbook of Tape Automated Bonding", McGraw-Hill, NY.1992, pp. 89-497.

John W. Balde "Goldable Flex and Thinned Silicon Multichip Packaging Technology", Kluwer Academic Publishers., 2003, pp. 5-86.

Michael G. Pecht et al., "Electronic Packaging, Materials and Their Properties", 1998, pp. 7-101.

Electrically Conductive Adhesive Transfer [online]. 3M, [retrieved on Dec. 21, 2004], Retrieved from Internet: <URL: www.3m.com/intl/tw/centers/,fg_industrial/notebook/conductive.html>.

G. Pitcher, "A flexible solution flexible circuits are finding wider application as products get smaller", New Electronics, International Publishing, vol. 33 No. 16, Sep. 26, 2000.

"Flexible Circuits Provide Firm Results, Electronic Packaging and Production", Cahners Publishing Co, vol. 39, No. 14, Dec. 1999.

H.W. Markstein, "Flexible circuits show design versatility", Electronic Packaging and Production, Cahners Publishing Co, vol. 29, No. 4, Apr. 1, 1989.

* cited by examiner

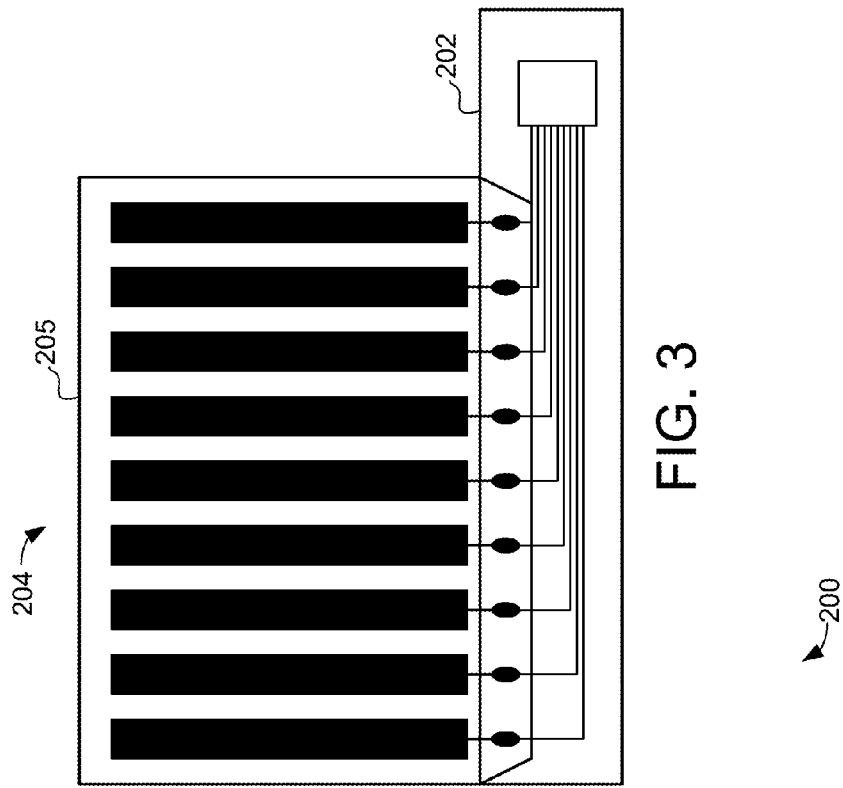
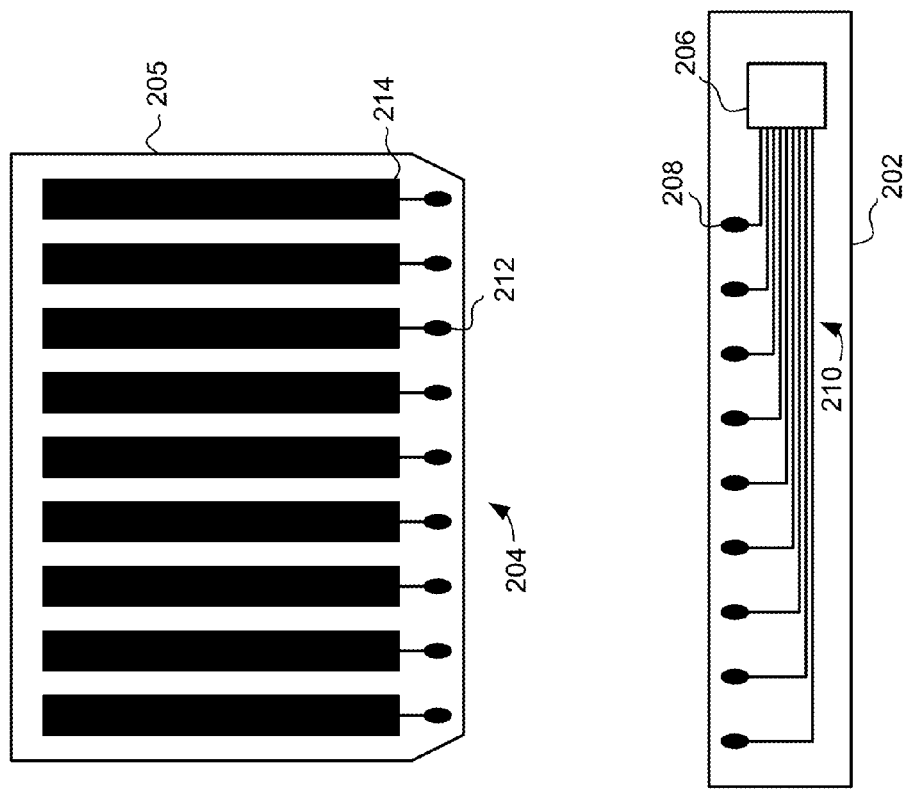

TOUCH PAD WITH FLEXIBLE SUBSTRATE

CROSS-REFERENCES TO RELATED APPLICATIONS

This is a continuation of U.S. application Ser. No. 13/306,551, filed Nov. 29, 2011, which is a continuation of U.S. application Ser. No. 12/209,762, filed Sep. 12, 2008, which is a continuation of U.S. Pat. No. 7,439,962, issued Oct. 21, 2008, both of which are incorporated herein by reference.

FIELD OF THE INVENTION

This invention generally relates to electronic devices, and more specifically relates to touch sensor devices.

BACKGROUND OF THE INVENTION

Touch sensor devices (also commonly called touch pads) are widely used in a variety of electronic systems. A touch sensor device is typically a sensitive surface that uses capacitive, resistive, inductive, optical, acoustic or other technology to determine the presence, location and or motion of one or more fingers, styli, and/or other objects. The touch sensor device, together with a finger or other object provides an input to the electronic system. For example, touch sensor devices are used as input devices for computers, such as notebook computers.

Touch sensor devices are also used in smaller devices, such as personal digital assistants (PDAs) and communication devices such as wireless telephones and text messaging devices. Increasingly, touch sensor devices are used in multimedia devices, such as CD, DVD, MP3 or other media players. Many electronic devices include a user interface, or UI, and an input device for interacting with the UI. A typical UI includes a screen for displaying graphical and/or textual elements. The increasing use of this type of UI has led to a rising demand for touch sensor devices as pointing devices. In these applications the touch sensor device can function as a cursor control device, selection device, scrolling device, character/handwriting input device, menu navigation device, gaming input device, button input device, keyboard and/or other input device.

Past designs of touch pads have had several notable limitations. One limitation has been the relative inflexibility of some designs to conform to the limited spaces available in some applications. For example, some designs have required large and inflexible circuit boards that prevented the touch pad from being used in small, low profile, or irregular spaces. One other notable limitation has been the cost of some previous designs. For example, some designs have relied exclusively on high cost materials for the substrates in the touch pads. The extensive use of these materials can be cost prohibitive for some applications. Finally, some previous designs have had limited long term reliability.

Therefore what is needed is an improved touch sensor device design that provides space flexibility and reliability without excessive device cost.

BRIEF SUMMARY OF THE INVENTION

The present invention provides a touch sensor device that uses a flexible circuit substrate to provide an improved input device. Specifically, the present invention uses a touch sensor controller affixed to the flexible circuit substrate, which is coupled to a sensor component to provide a flexible, reliable and cost effective touch sensor suitable for a wide variety of applications. For example, the touch sensor device may be mounted either above or below a flat or curved rigid substrate.

In one embodiment the touch sensor uses a flexible circuit substrate that provides relatively high temperature resistance. This allows the touch sensor controller to be affixed using reliable techniques, such as various types of thermal bonding. The sensor component can comprise a relatively low-temperature-resistant flexible substrate that can provide a cost effective solution. Taken together, this embodiment of the touch sensor provides reliability and flexibility at relatively low cost.

The sensor component can be electrically coupled to the flexible circuit substrate using a variety of suitable techniques. For example, in some capacitive touch sensors capacitive coupling can be used to provide connection between the flexible circuit substrate and the sensor component. In other embodiments ohmic connections can be provided through the use of solder, conductive adhesive, anisotropic conductive film, ultrasonic welding, or other structures suitable for the substrates and their pads.

In another embodiment the flexible circuit substrate of the touch sensor includes an integral flexible tail portion. The tail portion comprises a relatively narrow strip of flexible circuit substrate with at least one contact at its end for connection to an electronic system.

BRIEF DESCRIPTION OF DRAWINGS

The preferred exemplary embodiment of the present invention will hereinafter be described in conjunction with the appended drawings, where like designations denote like elements, and:

FIGS. 2 and 3 are schematic views of a first embodiment of a touch sensor device;

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

According to various exemplary embodiments, a touch sensor device is provided that uses a flexible circuit substrate to provide an improved input device. Specifically, the present invention uses a touch sensor controller affixed to the flexible circuit substrate, which is coupled to a sensor component to provide a flexible, reliable and cost effective touch sensor suitable for a wide variety of applications. In one embodiment the touch sensor uses a flexible circuit substrate that provides relatively high temperature resistance. This allows the touch sensor controller to be affixed using reliable thermal techniques, such as various types of soldering, thermal bonding, thermally activated adhesives and ultrasonic welding. Unfortunately, flexible circuit substrate materials capable of withstanding thermal bonding techniques are typically more expensive than those materials which cannot. Advantageously, the sensor component can comprise a relatively low-temperature-resistant substrate. Taken together, this embodiment of the touch sensor provides reliability and flexibility at relatively low cost.

Although the various embodiments described herein are referred to as "touch sensors" or "touch pads", these terms as used herein are intended to encompass not only conventional touch sensor devices, but also a broad range of equivalent devices that are capable of detecting the position of a one or more fingers, pointers, styli and/or other objects. Such devices may include, without limitation, touch screens, touch pads, touch tablets, biometric authentication devices, handwriting or character recognition devices, and the like. Similarly, the terms "position" or "object position" as used herein are intended to broadly encompass absolute and relative positional information, and also other types of spatial-domain information such as velocity, acceleration, and the like, including measurement of motion in one or more directions. Various forms of positional information may also include time history components, as in the case of gesture recognition and the like. Accordingly, touch sensors appropriately detect more than the mere presence or absence of an object and may encompass a broad range of equivalents.

Figure 1:
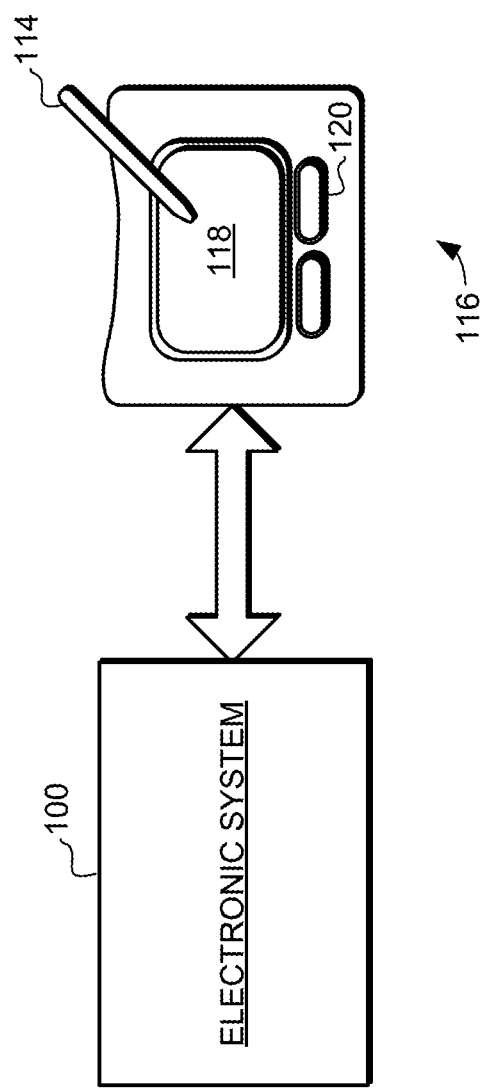
FIG. 1 is a block diagram of an exemplary system that includes a touch sensor device in accordance with an embodiment of the invention.

Turning now to the drawing figures, FIG. 1 is a block diagram of an exemplary electronic system 100 that is coupled to a touch sensor device 116. Electronic system 100 is meant to represent any type of personal computer, portable computer, workstation, personal digital assistant, video game player, telephone, media player or other device capable of accepting input from a user and of processing information. Accordingly, the various embodiments of system 100 may include any type of processor, memory or display. Additionally, the elements of system 100 may communicate via a bus, network or other interconnection. The touch sensor device 116 can be connected to the system 100 through any type of interface or connection, including PS/2, Universal Serial Bus (USB), wireless, or other type of connection to list several non-limiting examples.

Touch sensor device 116 is sensitive to the position of a stylus 114, finger and/or other object within a sensing region 118. "Sensing region" 118 as used herein is intended to broadly encompass any space above, around, in and/or near the touch sensor device 116 wherein the sensor of the touchpad is able to detect a position of the object. In a conventional embodiment, sensing region 118 extends from the surface of the sensor in one or more directions for a distance into space until signal-to-noise ratios prevent object detection. This distance may be on the order of centimeters or more, and may vary significantly with the type of position sensing technology used and the accuracy desired. Accordingly, the planarity, size, shape and exact locations of the particular sensing regions 116 will vary widely from embodiment to embodiment.

In operation, touch sensor 116 suitably detects a position of stylus 114 or other object within sensing region 118, and provides electrical or electronic indicia of the position to the electronic system 100. The system 100 appropriately processes the indicia to accept inputs from the user, to move a cursor or other object on a display, or for any other purpose.

The touch sensor 116 can use a variety of techniques for detecting the presence of an object. As several non-limiting examples, the touch sensor 116 can use capacitive, resistive, inductive, or optical techniques. In a capacitive implementation of a touch sensor a voltage is typically applied to create an electric field across the sensing surface. A capacitive touch sensor 116 would then detect the position of an object by detecting changes in capacitance caused by the object. Likewise, in a common resistive implementation a flexible top layer and a bottom layer are separated by insulating elements. Pressing the flexible top layer creates electrical contact between the top layer and bottom layer. The resistive touch sensor 116 would then detect the position of the object by detecting changes in resistance caused by the presence of the object. In an inductive implementation, the sensor might pick up loop currents induced by a resonating coil or pair of coils, and use some combination of the magnitude, phase and frequency to determine distance, orientation or position. In all of these cases the touch sensor 116 detects the presence of the object and delivers position information to the system 100.

In the illustrated embodiment the touch sensor 116 is proximate buttons 120. The buttons 120 can be implemented to provide additional input functionality to the touch sensor 116. For example, the buttons 120 can be used to facilitate selection of items using the touch sensor 116. Of course, this is just one example of how additional input functionality can be added to the touch sensor 116, and in other implementations the touch sensor 116 could include additional input devices. Conversely, the touch sensor 116 can be implemented with no additional input devices.

In this application the device to which the touch sensor connects to or communicates with will generally be referred to as an "electronic system". The electronic system could thus comprise any type of device in which a touch sensor can be implemented or coupled to. Furthermore, it should be noted that the touch sensor could be implemented as part of the electronic system, or coupled to the electronic system using any suitable technique. As non-limiting examples the electronic system could thus comprise any type of computing device, media player, communication device, or another input device (such as another touch sensor or keypad). In some cases the electronic system is itself a peripheral to a larger system. For example, the electronic system could be a data input or output device, such as a remote control or display device, that communicates with a computer or media system (e.g., remote control for television) using a suitable wireless technique. It should also be noted that the various elements (processor, memory, etc.) of the electronic device could be implemented as part of the electronic system, as part of the touch sensor, or as a combination thereof. Additionally, the electronic system could be a host or a slave to the touch sensor.

According to various exemplary embodiments, a touch sensor device is provided that uses a flexible circuit substrate to provide an improved input device. In one embodiment a touch sensor controller is affixed to the flexible circuit substrate, which is coupled to a sensor component to provide a flexible, reliable and cost effective touch sensor suitable for a wide variety of applications. Additionally, the touch sensor in one embodiment uses a flexible circuit substrate that provides relatively high temperature resistance. This allows the touch sensor controller to be affixed using reliable techniques, such as various types of thermal bonding, without negatively impacting the dimensional stability of the substrate. The sensor component can comprise a relatively low-temperature-resistant substrate with at least one sensing element that can provide a cost effective solution. Taken together, this embodiment of the touch sensor provides reliability, flexibility and relatively low cost.

Turning now to FIGS. 2 and 3, a first embodiment of a touch sensor device 200 is illustrated. The touch sensor device 200 includes a flexible circuit substrate 202 and a sensor component 204. FIG. 2 illustrates the flexible circuit substrate 202 and sensor component 204 separately, while FIG. 3 illustrates the substrates coupled together as they may be in a completed touch sensor device.

In the illustrated embodiment, the flexible circuit substrate 202 includes a touch sensor controller 206, the touch sensor controller 206 coupled to a plurality of pads 208 through a plurality of conductors 210. The sensor component 204 includes a substrate 205 and a plurality of columnar sensing elements 214 for detecting an object proximate to the sensing elements 214. Each of the plurality of sensing elements 214 is coupled to a pad 212. When assembled together and in operation, the touch sensor device 200 detects objects that are proximate to the sensing elements 214, and using the pads 208 and 212, conductors 210, and controller 206 processes and communicates information regarding the position and/or motion of the proximate object.

While the embodiment illustrated in FIGS. 2 and 3 shows the sensing elements 214 arranged as substantially planar and in columns, this is just one example of how the sensing elements 214 could be arranged. For example, the sensing elements 214 could have concave or convex features, be simple polygons or have complex shapes, or be arranged in circles or other suitable non-rectangular shapes. The configuration, shape and number of sensing elements 214 would typically be determined by the sensing requirements of the specific application, and the type of sensing technology being used. For example, typically the shapes of sensing elements 214 would differ between touch sensors that use capacitive sensing and those that use inductive or resistive sensing. Some sensing technologies, such as some capacitive and resistive sensing technologies, can be enabled with only one single sensing element 214 or one single pad 208. Similarly, flexible circuit substrate 202 and sensor component 204 also differ in shape, size and arrangement from those shown, depending on the specific application.

The sensing elements 214 on the sensor component 204 and the controller 206 on the flexible circuit substrate 202 are coupled together through the plurality of pads 208 and the plurality of pads 212. The pads 208 and 212 can be any suitable type of connection structure. Furthermore, any suitable type of connection mechanism can be used to implement the electrical connection between pads 208 and 212. For example, the pads 208 and 212 can comprise conductive electrodes that are electrically connected together with conductive adhesive, conductive foam or other conductive media. In other cases the pads 208 and 212 could be coupled together capacitively, or held together using non-conductive adhesive. Other examples include inductive or significantly resistive coupling. It should also be noted that while the pads 208 and 212 are illustrated as relatively larger than the conductors 210, this is not required. In some cases the pads 208 could just comprise specific portion of the conductors 210 designed to provide connection between the layers. It should be noted that in some embodiments more than one layer of conductors would be formed on the flexible circuit substrate 202, with those layers separated by one or more dielectric material layers.

The sensing elements 214 and conductors 210, or any other conductive elements in the touch sensor device, can comprise any suitable type(s) of conductive material, such as conductive ink. The sensing elements 214 and conductors 210 can also be formed on the sensor component 204 using any suitable process. One example is conductive ink printing, such as screen, ink jet, or offset/transfer printing. In other examples, the sensing elements 214 and conductors 210 can be metallic conductors patterned on flexible circuit substrate 202 by deposition, etching, molding, stamping, and/or other patterning methods. The processes listed above are only examples of possible manufacturing methods for constructing either substrate and should not be considered as limiting in scope.

It should also be noted that in some embodiments it is desirable for the sensor component 204 and flexible circuit substrate 202 to have different minimum conductor pitches. For example, printed inks typically have larger pitch than etched conductors. This is due to the single step masking process using a screen or transfer mold, which is inexpensive, but currently difficult to hold vertical and horizontal tolerances (using mechanical alignment). Conversely, photo mask and etched processes have more steps and consumed materials, but the photo mask resist is very well controlled in thickness, and the exposure step is typically optically aligned each time. Stamped conductors can hold quite tight pitches, but are less common, and not easily aligned in multiple layers. Screen printing is usually limited by the thickness of the screen that can be handled, while etched or plated electrodes are limited by over etching or plating due to the thickness of the etched or plated electrode or resist. For all of these reasons it may be desirable for the sensor component 204 and flexible circuit substrate 202 to have different minimum conductor pitches.

The touch sensor controller 206 is coupled to the plurality of pads 208 through a plurality of conductors 210. In general, the touch sensor controller 206 comprises one or more integrated circuits that receives electrical signals from the sensing elements 214 and communicates with the electronic system. The touch sensor controller 206 can also perform a variety of processes on the signals received from the sensing elements 214 to implement the touch sensor. For example, the touch sensor controller 206 can select or connect individual sensor electrodes, detect presence/proximity and report a position when a threshold is reached, and/or interpret and wait for a valid tap/stroke/character/button sequence before reporting it to the host, or indicating it to the user. In other embodiments the touch sensor controller 206 passes the signals to the electronic system and the majority of the processing is performed on other processors such as those on the electronic system. In this case, the touch sensor controller 206 receives electrical signals from the sensing elements 214 and facilitates object sensing by communicating with the electronic system.

In certain embodiments, one or more active or non-active components may interface with touch sensor device 200. An example of an active component would be a button and an example of a non-active component would be a light-emitting diode (LED) or power supply. These components may be part of an electronic system and connected to the flexible circuit substrate 202 or independent of flexible circuit substrate 202.

As discussed above, the touch sensor device 200 uses a flexible circuit substrate to provide an improved input device. Specifically, touch sensor controller 206 is affixed to the flexible circuit substrate, which is coupled to a sensor component to provide a flexible, reliable and cost effective touch sensor suitable for a wide variety of applications. The touch sensor controller 206 can be affixed to the flexible circuit substrate 202 using a variety of techniques. To facilitate affixing the touch sensor controller 206, the flexible circuit substrate 202 would typically include a plurality of landing pads or other suitable coupling structures for receiving the touch sensor controller 206. The type of structures used would depend on the packaging of the controller 206. In many cases the structures would be formed using the same processing that forms the conductors 210 and pads 208.

In one embodiment the touch sensor uses a flexible circuit substrate material that provides relatively high temperature resistance. This allows the touch sensor controller 206 to be affixed using thermal bonding processes that involve the use of heat to affix the controller 206. For example, the touch sensor controller can be affixed to the flexible circuit substrate 202 using a thermal bonding process such as soldering, ultrasonic welding, thermally activated adhesive or thermal compression bonding. These and other thermal bonding processes typically have the advantage of higher reliability, stability, lower cost, or easier manufacturability when compared to typical lower-temperature processes such as conductive adhesive.

In general a material has heat resistance to a temperature if it can be subjected to that temperature for a length of time without suffering significant degradation, such as a significant loss of dimensional stability. The amount of heat resistance desired for the flexible circuit substrate 202 would depend upon the thermal bonding process used and the heat required for that process. For example, to reliably bond a controller to a flexible circuit substrate using traditional solder reflow, the substrate may need to have temperature resistance to 150° C.

A variety of different types of materials can be used for the flexible circuit substrate 202. For example, a condensate film or thermoset material such as polyimide has a relatively high level of temperature resistance. Other temperature-resistant materials that can be used for a flexible circuit substrate 202 include epoxy resins and liquid crystal polymer films. Of course, these are just examples of the types of materials that can be used for the flexible circuit substrate 202.

The use of flexible circuit substrate 202 in a touch sensor device 200 also provides flexibility in shaping the device. For example, a flexible circuit substrate 202 can facilitate folding, bending or otherwise manipulating the touch sensor to conform to a limited space. This can facilitate the use of the touch sensor device 200 in applications where space is at a premium and where the shape of the overall device requires flexibility in the shape of the circuit substrate. Other potential reasons for folding or bending the substrate 202 include folding to provide a shield for the substrate, to reduce cost by improving panelization, or to connect two different parts of the substrate together in a single layer patterning process.

As described above, in one embodiment the sensor component 204 can comprise a relatively low-temperature-resistant substrate 205 that can provide a cost effective solution. In this embodiment the sensor component 204 has a temperature resistance that is less than (or equal to) the flexible circuit substrate 202. The relatively low temperature resistance of the sensor component 204 can provide significant cost advantages when compared to making the entire touch sensor using high-temperature-resistant material. Thus, taken together, the use of a relatively high-temperature-resistant flexible circuit substrate with a relatively low-temperature-resistant sensor substrate provides reliability, flexibility and relatively low cost. Additionally, other potential differences between the flexible circuit substrate and the sensor layer substrate include thickness, which controls the bending radius. Similarly, the flexible circuit substrate could also be patterned in a more expensive way to connect to the controller, while a less expensive method is used for the sensor substrate. Alternatively, a similar patterning method, but of a completely different (e.g., transparent) conductor such as indium tin oxide (ITO) could be used for the sensor.

A variety of different materials can be used for the sensor component 204. For example, a thermoplastic material such as polyethylene terephthalate (PET) can be used. These materials provide reduced heat resistance when compared to common thermoset or condensate films, but at a significantly reduced cost. This is often due to the extra cost of an expensive process such as extrusion or molding compared to a "blow" plastic film process. For example, some thermoplastic materials have a heat resistance of 120° C. or less. Of course, this is just one example of the type of materials that can be used for the sensor component 204.

In some applications it is desirable to use a flexible material for the sensor component 204. The use of a flexible material for the sensor component 204 provides flexibility in shaping the device. For example, the use a flexible material can facilitate shaping of the touch sensor to provide a curved sensing surface. Examples of flexible materials that can be use for sensor component 204 include vinyl, PET, polystyrene (PS), polyvinylchloride (PVC), and polycarbonate.

Figure 4:
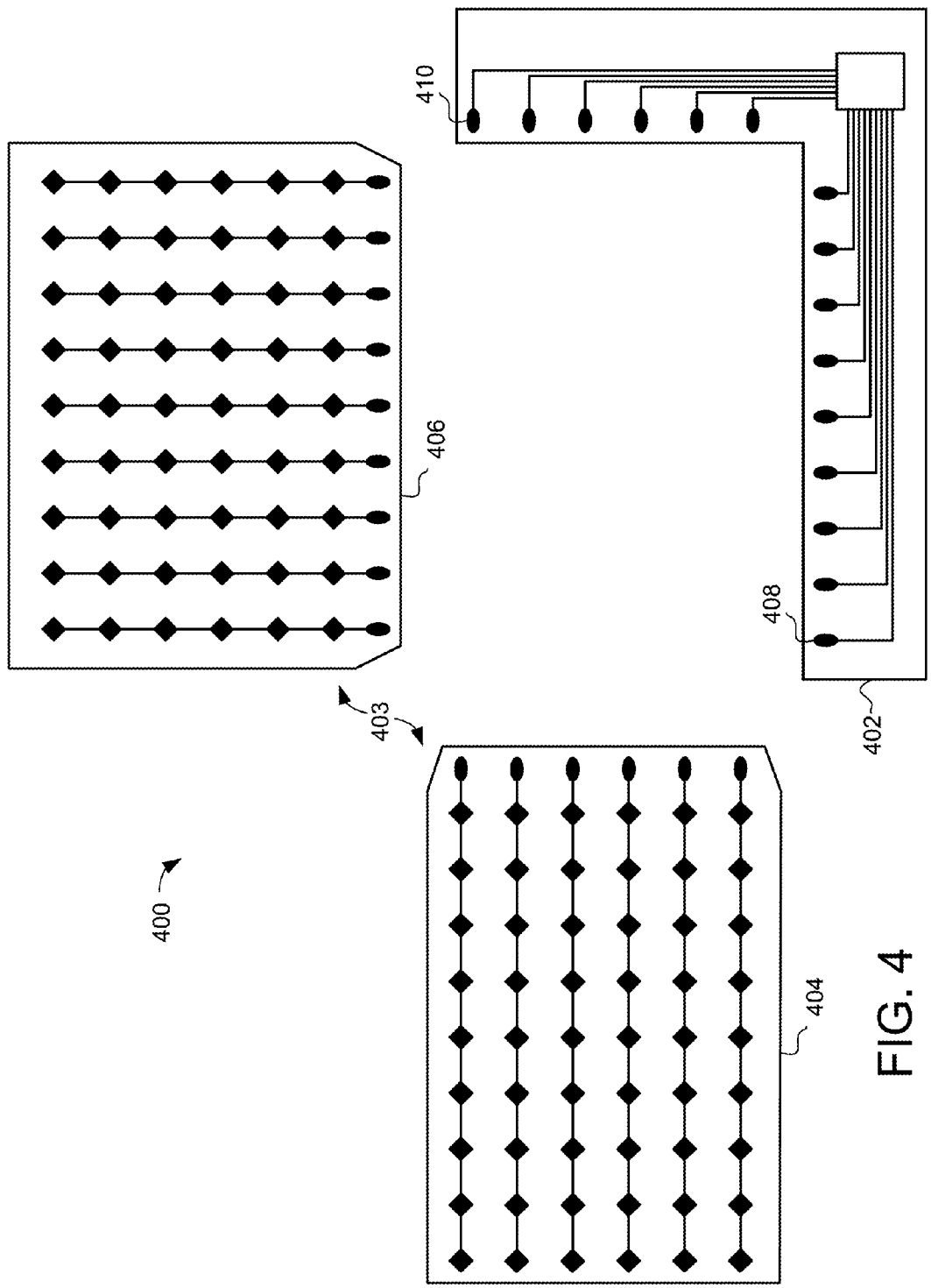
FIGS. 4 and 5 are schematic views of a second embodiment of a touch sensor device.
Figure 5:
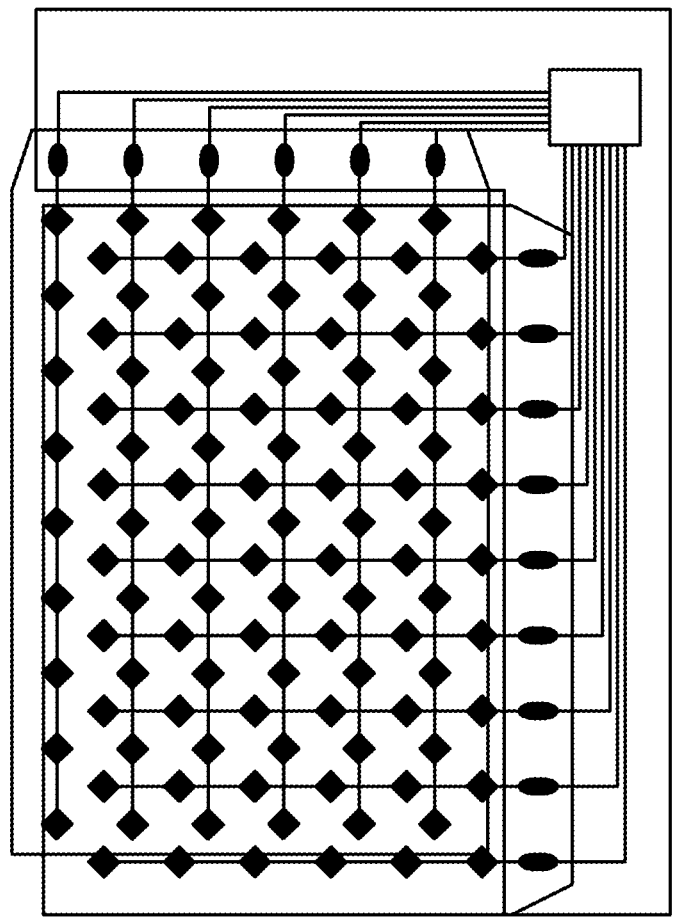

Turning now to FIGS. 4 and 5, a second embodiment of a touch sensor device 400 is illustrated. The touch sensor device 400 includes a flexible circuit substrate 402 and a sensor component 403. The sensor component 403 includes first sensor substrate 404 and a second sensor substrate 406. FIG. 4 illustrates the flexible circuit substrate 402, first sensor substrate 404 and second sensor substrate 406 separately, while FIG. 5 illustrates the substrates 402, 404 and 406 coupled together as they would be in a completed touch sensor device. In this embodiment the two sensor substrates 404 and 406 each provide object position detection in a different direction. Specifically, each sensor substrate includes a set of sensing elements arranged in a different, nonparallel (e.g., orthogonal) direction. Taken together, the two sensor substrates 404 and 406 provide the ability to detect and precisely locate a proximate object in two dimensions. Alternatively, the two sensor substrates 404 and 406 can also enable sensing technologies that require non-coplanar sensing elements, such as some resistive sensing technologies. To facilitate the use of two sensor substrates 404 and 406, the flexible circuit substrate includes a first plurality of pads 408 and a second plurality of pads 410, each of the pluralities of pads coupled to the controller through pluralities of conductors.

Like the first embodiment, this touch sensor device 400 includes a touch sensor controller affixed to the flexible circuit substrate 402, and coupled to the sensing elements through pluralities of conductors and the pluralities of pads. When assembled together and in operation, the touch sensor device 400 detects objects that are proximate to the sensing elements. Using the controller, the touch sensor 400 communicates information regarding the position and/or motion of the proximate object to an electronic system (not shown in FIG).

Like the first embodiment, the touch sensor device 400 uses a flexible circuit substrate to provide an improved input device. Specifically, the touch sensor uses a flexible material that provides relatively high temperature resistance. This allows the touch sensor controller to be affixed using thermal bonding processes that involve the use of heat. Conversely, the first touch sensor substrate 404 and second touch sensor substrate 406 can both or either comprise a relatively low-temperature-resistant substrate that can provide a cost effective solution. The relatively low temperature resistance of the sensor substrates 404 and 406 can provide significant cost advantages when compared to making the entire touch sensor using high-temperature-resistant material. Thus, taken together the use of a relatively high-temperature-resistant flexible circuit substrate with a relatively low-temperature-resistant sensor component provides reliability, flexibility and relatively low cost.

As a variation on this embodiment, instead of using two separate touch sensor substrates 404 and 406, the sensor elements for both directions can be formed on a single sensor substrate. For example, the sensor elements for both directions can be formed on opposite sides of a single sensor substrate. In this embodiment, the pads 408 and 410 may be located on opposite sides of the flexible circuit substrate 402 to facilitate coupling to the single touch sensor substrate. Alternatively, the sensor elements for both directions can be formed on the same side of a single sensor substrate, separated by an insulative material. In this embodiment, the insulative material between sensor elements is preferably formed using a process similar to those for forming the sensor elements. All these embodiments can provide two dimensional sensing while requiring only one sensor substrate, or can be used to enable other sensing technologies. This can further reduce material costs at the expense of somewhat increased manufacturing complexity. Other possible variations in these embodiments include folding the flexible circuit substrate. The flexible circuit substrate can also be slit to allow one substrate to pass through another or to increase tail length or have multiple tails. Finally, a variety of other devices could be added to the flexible circuit substrate including alignment holes or other features for aiding assembly, lamination, bonding, or final connection.

Figure 6:
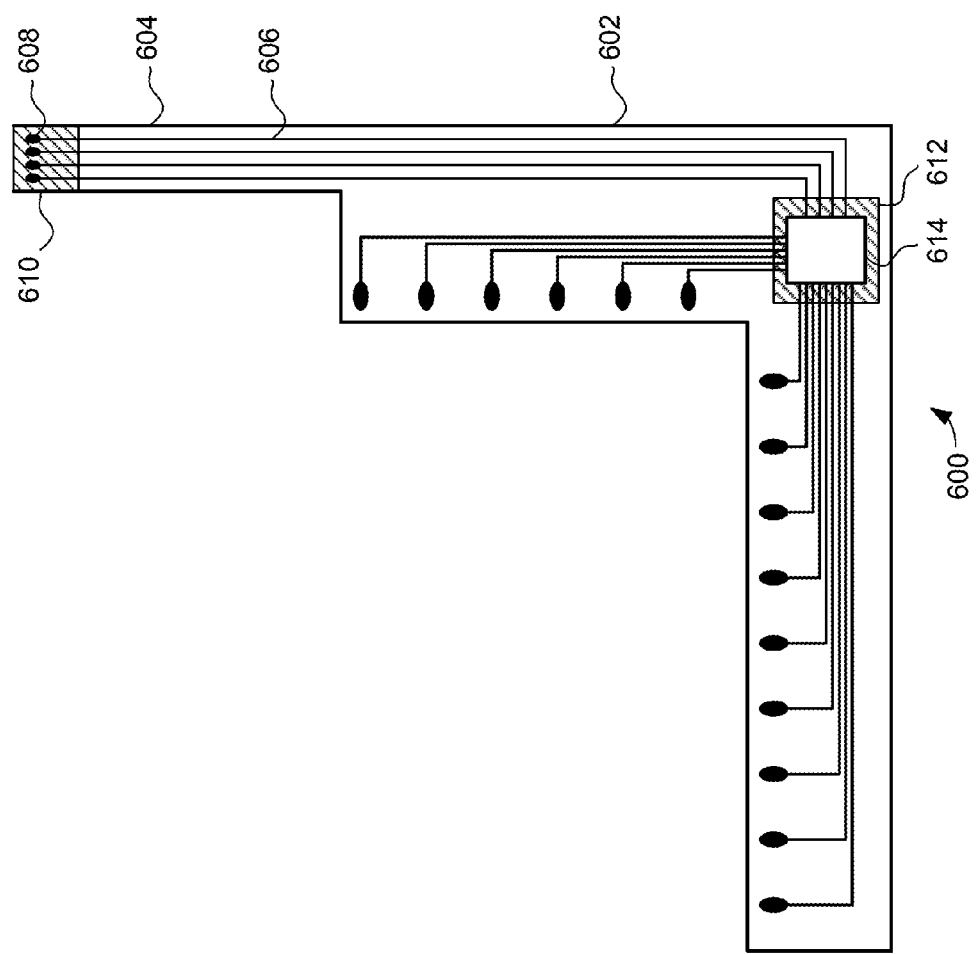
FIG. 6 is a schematic view of a flexible circuit substrate in accordance with a third embodiment.

Turning now to FIG. 6, a third embodiment touch sensor device 600 is illustrated. In this embodiment the touch sensor 600 includes a flexible circuit substrate 602 and at least one sensor component (not shown in FIG.). This embodiment, like the previous two embodiments uses a flexible circuit substrate with relatively high temperature resistance to provide an improved input device. When combined with relatively low-temperature-resistant sensor components the embodiment can provide significant cost advantages when compared to making the entire touch sensor using high-temperature-resistant material.

In this embodiment, the flexible circuit substrate 602 includes an integral tail portion 604. The tail portion 604 comprises a relatively narrow strip of flexible circuit substrate with at least one conductor 606 and at least one contact electrode 608 at its end for connection or communication to an electronic system. Because the integral tail portion 604 is made of a flexible circuit substrate material and is relatively narrow, the integral tail portion 604 can be shaped, bent, or otherwise manipulated to provide the connection to the electronic system. Specifically, the integral tail portion 604 can be bonded directly to contact electrodes of the electronic system, plugged into a suitable connector on the electronic system, or into a suitable connector that is coupled to the electronic system. In some embodiments a first stiffener material 610 is added to the end of the integral tail portion 604. The stiffener material 610 reduces the flexibility in that portion of the substrate by relieving strain and thus improves the reliability of the connection between the connector and the tail portion 604. A variety of types of materials can be used as the stiffener 610, including PET, polyimide, polystyrene, and PVC. The addition of the tail portion 604 to the flexible circuit substrate 600 can thus provide connection to the electronic system, and can thus further reduce the complexity and cost of the overall device. It should be noted that the tail portion 604 could be configured in a variety of shapes and structures. It should also be noted that a tail portion can be located on a flexible sensor substrate, such as those shown in the first and second embodiments, in addition to or in place of tail portion 604.

In FIG. 6, a second stiffener 612 is formed under the touch sensor controller 614. The stiffener 612 under the touch sensor controller 614 can serve to improve the reliability of the connection between the touch sensor controller 614 and the flexible circuit substrate 602. The stiffener 612 provides strain relief and reduces bending curvature due to or concentrated by connection to other elements. Additionally, the stiffener 612 may also provide greater flatness or stability for mechanical manipulation during assembly or connection. The stiffener 612 might also be formed as a fillet of adhesive at an interconnection between a flexible substrate and other connector element of the electrical system. For example, an acrylic, an epoxy, or UV cured adhesive may be used.

Figure 7:
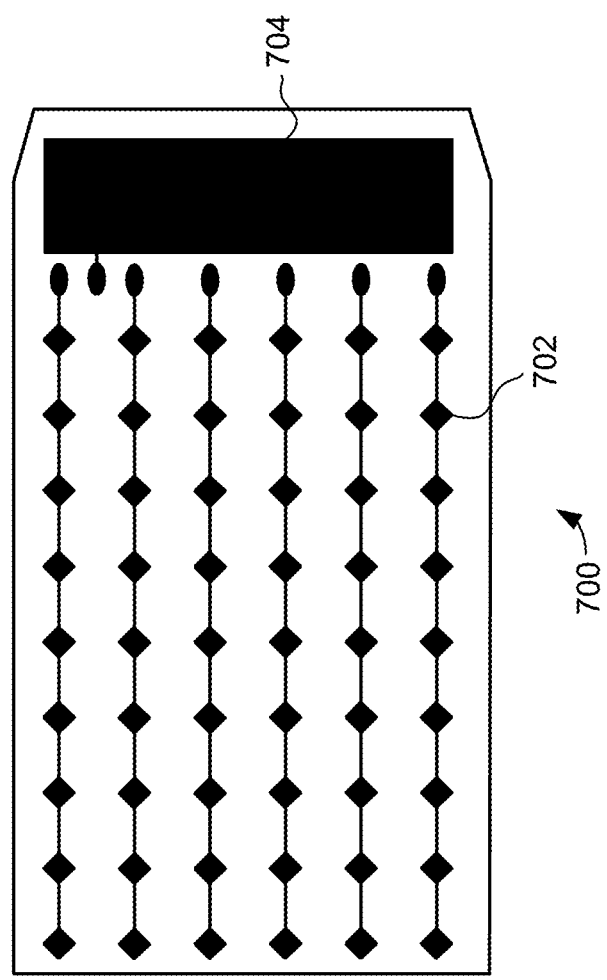
FIG. 7 is a schematic view of a sensor component in accordance with a fourth embodiment.

Turning now to FIG. 7, another embodiment of a touch sensor component 700 is illustrated. The touch sensor component 700 again includes a plurality of sensing elements 702 for sensing an object proximate to a touch sensor. In this embodiment the touch sensor component 700 also includes a conductive shield 704. The conductive shield 704 is formed on the sensor component 700 in a location where it will shield sensitive elements of the touch sensor. For example, when the conductive shield is formed and assembled as illustrated in FIG. 5, the conductive shield 704 will prevent unwanted capacitance from affecting the conductors on the flexible circuit substrate. The conductive shield 704 can be actively driven or grounded through a conductor disposed directly on the flexible sensor substrate 700 or the corresponding flexible circuit substrate, or through any other electrical connection to the corresponding touch sensor device or electronic system. Thus, the conductive shield 704 can increase the reliability, repeatability and accuracy of the touch sensor.

The conductive shield 704 can be of any size or shape, and formed using a variety of techniques. Typically, it will be desirable to form the conductive shield 704 with the same processing steps used to form the sensing elements 702. However, different processing steps may be preferred when the guard is formed with different optical properties (transparent or opaque) than the sensing elements. In particular, when a transparent shield is needed, an inorganic ITO or an organic pedot transparent conductor can be used. Additionally, it may be useful to select a different location for conductive shield 704, to fold, or to bend the flexible sensor substrate 700. Conductive shield 704 can thus be better positioned for shielding the flexible circuit substrate, or alternatively be positioned to shield the flexible circuit substrate, or another element of the system (such as the flexible sensor substrate 700 itself). It should be noted that this is just one example of where a conductive shield can be provided to shield the touch sensor device. In other cases it may be desirable to provide one or more conductive shield(s) on a flexible circuit substrate, on another substrate in the touch sensor device, on a part of the touch sensor case or support, or on a part of the electronic system. In all these cases the conductive shield(s) can be used to improve the performance of the touch sensor by reducing undesirable electromagnetic interference that is either self induced or externally generated.

It should be noted that while the sensor layers illustrated in FIGS. 1-7 have been substantially rectangular in shape, that a variety of other shapes could be used. For example, a circular shaped touch sensor component can be used to provide a circular sensing surface. The touch sensor can also be non-planar to accommodate curved or angular surfaces. Additionally, the sensing elements themselves can have a variety of different shapes.

The embodiments of the present invention thus provide a touch sensor device that uses a flexible circuit substrate to provide an improved input device. Specifically, the present invention uses a touch sensor controller affixed to the flexible circuit substrate, which is coupled to a sensor component to provide a flexible, reliable and cost effective touch sensor suitable for a wide variety of applications. In one embodiment the touch sensor uses a flexible circuit substrate that provides relatively high temperature resistance. This allows the touch sensor controller to be affixed using reliable techniques, such as various types of soldering. The sensor component can comprise a relatively low-temperature-resistant substrate that can provide a cost effective solution. Taken together, this embodiment of the touch sensor provides reliability, flexibility and relatively low cost.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit of the forthcoming claims.

What is claimed is:

1. A capacitive device, comprising:
   a flexible circuit substrate dimensionally stable up to a first temperature;
   a first plurality of conductive pads disposed on the flexible circuit substrate;
   a transparent sensor substrate that is dimensionally stable up to a second temperature;
   a second plurality of conductive pads disposed on the transparent sensor substrate, wherein a first pad of the first plurality of conductive pads is coupled to a first pad of the second plurality of conductive pads;
   a first plurality of transparent sensing elements disposed on the transparent sensor substrate, wherein a first sensing element of the plurality of transparent sensing elements is communicatively coupled to the first pad of the second plurality of conductive pads; and
   a second plurality of transparent sensing elements disposed on the transparent sensor substrate, wherein a first sensing element of the second plurality of transparent sensing elements is communicatively coupled to a second pad of the second plurality of conductive pads, wherein the first and second plurality of transparent sensing elements are disposed on a same side of the transparent sensor substrate, and configured to detect changes in capacitance.

2. The capacitive device of claim 1, wherein the transparent sensor substrate is flexible.

3. The capacitive device of claim 1, wherein the first temperature is high enough to thermally bond a controller to the flexible circuit substrate without significant thermally induced degradation to the flexible circuit substrate.

4. The capacitive device of claim 1, wherein the second temperature is lower than the first temperature.

5. The capacitive device of claim 1, further comprising:
   a first plurality of conductors disposed on the transparent sensor substrate, the first plurality of conductors communicatively coupling the first plurality of conductive pads with the first plurality of transparent sensing elements, wherein the first plurality of conductors has a first conductor pitch; and
   a second plurality of conductors disposed on the flexible circuit substrate, wherein the second plurality of conductors has a second conductor pitch smaller than the first conductor pitch.

6. A capacitive device comprising:
   a flexible circuit substrate that is dimensionally stable up to a first temperature,
   a first plurality of conductors disposed on the flexible circuit substrate; and
   a first plurality of conductive pads disposed on the flexible circuit substrate and coupled to the first plurality of conductors, wherein the first plurality of conductive pads is configured to couple to a second plurality of conductive pads disposed on a sensor substrate, wherein the sensor substrate is dimensionally stable up to a second temperature that is lower than the first temperature and wherein the capacitive sensor substrate is not dimensionally stable at the first temperature, wherein the capacitive device is configured to detect changes in capacitance.

7. The capacitive device of claim 6, further comprising a controller disposed on the flexible circuit substrate.

8. The capacitive device of claim 7, wherein the first temperature is high enough to thermally bond the sensor controller to the flexible circuit substrate without significant thermally induced degradation to the flexible circuit substrate.

9. The capacitive device of claim 6, wherein the flexible circuit substrate is configured to be bent.

10. The capacitive device of claim 6, wherein the flexible circuit substrate is configured to be coupled to both first and second sides of the sensor substrate.

11. The capacitive device of claim 6, wherein the flexible circuit substrate is configured to be coupled to the sensor substrate and a second sensor substrate.

12. The capacitive device of claim 6, wherein the first plurality of conductive pads and the second plurality of conductive pads are configured to couple the first plurality of conductors having a first conductor pitch with a second plurality of conductors disposed on the sensor substrate having a second conductor pitch, wherein the second conductor pitch is greater than the first conductor pitch.

13. A capacitive device comprising:
   a sensor substrate;
   a first plurality of conductor pads disposed on the sensor substrate, wherein the first plurality of conductor pads is configured to be coupled to a second plurality of conductor pads disposed on a flexible circuit substrate that is dimensionally stable up to a first temperature, wherein the sensor substrate is dimensionally stable up to a second temperature that is lower than the first temperature and wherein the sensor substrate is not dimensionally stable at the first temperature;
   a first plurality conductors disposed on the sensor substrate and coupled to the first plurality of conductor pads; and
   a first plurality of sensing elements disposed on the sensor substrate and coupled to the first plurality of conductors, wherein the sensing elements are configured detect changes in capacitance.

14. The capacitive device of claim 13, wherein the sensor substrate is transparent.

15. The capacitive device of claim 13, wherein the sensor substrate is flexible.

16. The capacitive device of claim 13, further comprising the flexible circuit substrate, wherein the second plurality of conductor pads communicatively couples the plurality of sensing elements to a touch sensor controller.

17. The capacitive device of claim 13, the capacitive device further comprises a second plurality of sensing elements, wherein the first plurality of sensing elements and the second plurality of conductive sensing elements are disposed on a same side of the sensor substrate.

18. The capacitive device of claim 13, the capacitive device further comprises a second plurality of sensing elements, wherein the first plurality of sensing elements is disposed on a first side of the sensor substrate and the second plurality of sensing elements is disposed on a second side of the sensor substrate.

19. The capacitive device of claim 13, the capacitive device further comprises:
- a second sensor substrate;
- a third plurality of conductor pads disposed on the second sensor substrate, wherein the third plurality of conductor pads is configured to be coupled to a fourth plurality of conductor pads disposed on the flexible circuit substrate;
- a second plurality of conductors disposed on the second sensor substrate and coupled to the third plurality of conductor pads; and
- a second plurality of sensing elements disposed on the second sensor substrate and coupled to the second plurality of conductors, wherein in the second plurality of sensing elements are configured to detect changes in capacitance.

20. The capacitive device of claim 13, wherein the first plurality of conductive pads and the second plurality of conductive pads are configured to couple the first plurality of conductors having a first conductor pitch with a second plurality of conductors disposed on the flexible circuit substrate having a second conductor pitch, wherein the first conductor pitch is greater than the second conductor pitch.

* * * * *